United States Patent [19]

Netsu et al.

[11] Patent Number: 5,186,192
[45] Date of Patent: Feb. 16, 1993

[54] APPARATUS FOR CLEANING SILICON WAFER

[75] Inventors: Shigeyoshi Netsu; Masaki Kameya, both of Selangor, Malaysia; Yasuyuki Harada, Tama; Hiroshi Amano, Shizuoka, both of Japan

[73] Assignees: Shin-Etsu Handotai Co., Ltd.; Pre-Tech Co., Ltd., both of Tokyo, Japan

[21] Appl. No.: 804,451

[22] Filed: Dec. 10, 1991

[30] Foreign Application Priority Data

Dec. 14, 1990 [JP] Japan .................................. 2-402400
Nov. 19, 1991 [JP] Japan .................................. 3-302917

[51] Int. Cl.⁵ ................................................ B08B 3/10
[52] U.S. Cl. ..................................... 134/68; 134/95.3; 134/102.1; 134/902; 134/184; 134/199; 134/200
[58] Field of Search ................... 134/94, 95, 102, 184, 134/200, 902, 76, 162, 199, 104.2, 68

[56] References Cited

U.S. PATENT DOCUMENTS

| 3,734,108 | 5/1973 | Almegard et al. | 134/76 |
| 4,694,527 | 9/1981 | Yoshizawa | 134/902 X |
| 4,777,970 | 10/1988 | Kusuhara | 134/902 |
| 4,983,223 | 1/1991 | Gessner | 134/76 X |
| 5,027,841 | 7/1991 | Breunsbach et al. | 134/902 X |
| 5,069,235 | 12/1991 | Vetter | 134/902 X |

FOREIGN PATENT DOCUMENTS

| 3815018 | 12/1988 | Fed. Rep. of Germany | 134/902 |
| 2601890 | 1/1988 | France | |
| 2-257632 | 10/1990 | Japan | |

Primary Examiner—Frankie L. Stinson
Attorney, Agent, or Firm—Nixon & Vanderhye

[57] ABSTRACT

Device for cleaning silicon wafers having an upper mist-generating chamber with a high frequency oscillator to generate an aqueous hydrofluoric acid mist and a lower region processing chamber separated by a partitioning wall having a shutter to open and close. Silicon wafers are held in an upright position in a rack. The processing chamber and the shutter have gas jets to eject gas between the silicon wafers and water spray heads in the processing chamber to spray water between the silicon wafers.

7 Claims, 2 Drawing Sheets

APPARATUS FOR CLEANING SILICON WAFER

BACKGROUND OF THE INVENTION

1. Field of the Invention

The present invention relates to an apparatus for cleaning silicon wafers by use of the mist of an aqueous hydrofluoric acid solution.

2. Description of the Related Art

As a conventional silicon wafer-cleaning method that uses an aqueous hydrofluoric acid solution, the following two methods are known: (1) a method in which silicon wafers are immersed in a tube filled with an aqueous hydrofluoric acid solution; and (2) a method in which silicon wafers are exposed to jets of an aqueous hydrofluoric acid solution by means of a high-pressure jet pump.

However, these methods are faced with the problems below. In the case of cleaning method (1), silicon is gradually dissolved in the aqueous hydrofluoric acid solution, due to the repeated execution of a cleaning operation. Since, therefore, the etching speed of the silicon of the aqueous hydrofluoric acid solution is gradually degraded as the cleaning operations are repeated, the etching conditions have to be controlled to keep the speed constant within predetermined allowable limits selecting the silicon concentration of the aqueous hydrofluoric acid solution one of the important factors to be monitored and controlled. This control is very troublesome in practice. In the case of cleaning method (2), silicon wafers are exposed to jets of an aqueous hydrofluoric acid solution, so that it is inevitable that part of the silicon wafers are not exposed to the aqueous hydrofluoric acid solution, resulting in ununiform etching of the wafers. It should be noted that particles of a certain substance are originally contained in the aqueous hydrofluoric acid solution. Due to such particles, the silicon wafers are liable to be contaminated. The contamination of the silicon wafers is serious particularly in cleaning method (1), since in this method the amount of contaminating substance contained in the original aqueous hydrofluoric acid solution increases each time the aqueous hydrofluoric acid solution is used for etching silicon wafers, and the silicon wafers are contaminated more in the subsequent etching step.

As is understood from the above, the two conventional cleaning methods do not permit the two sides of a silicon wafer to be uniformly etched with a high degree of purity. Further, the methods themselves introduce secondary contamination, due to the particles contained in the aqueous hydrofluoric acid solution.

SUMMARY OF THE INVENTION

Accordingly, one object of the present invention is to provide a silicon wafer-cleaning apparatus which can adhere the two sides of a silicon wafer with a mist of an aqueous hydrofluoric acid solution free of particles of contaminating substance and which permits the silicon wafer to be uniformly etched with a high degree of purity on the surface.

Another object of the present invention is to provide a silicon wafer-cleaning apparatus which etches the two sides of a silicon wafer and can subsequently rinse the silicon wafer in the same chamber as that in which the etching treatment is executed.

Still another object of the present invention is to provide a silicon wafer-cleaning apparatus which prevents particles of contaminating substance from adhering to the two sides of a silicon wafer, when the silicon wafer has just been etched and is therefore highly active, and further prevents an oxide film from being excessively formed on the two sides of that silicon wafer.

To achieve these objects, the present invention provides a silicon wafer-cleaning apparatus comprising:

a chamber which is divided into an upper region and a lower region by a partitioning wall having a communication section, the upper region defining a mist-generating chamber and the lower region defining a processing chamber;

opening/closing means including a shutter for closing the communication section of the partitioning wall;

a high-frequency oscillation member, attached to the chamber, for generating mist of an aqueous hydrofluoric acid solution in the mist-generating chamber;

a high-frequency oscillator for supplying high-frequency power to the high-frequency oscillation member;

conveyance means for conveying a storage member in which a plurality of silicon wafers are held in an upright state, to the processing chamber;

a plurality of gas-ejecting means, attached to the chamber and the shutter, for ejecting a gas toward regions between the silicon wafers held in the storage member;

pure water-spraying means, attached to the chamber, for spraying pure water toward regions between the silicon wafers held in the storage member; and gas exhaust means arranged inside the processing chamber to be lower than the storage member.

It is preferable that the aqueous hydrofluoric acid solution have a 0.1 to 50% hydrogen fluoride concentration with reference to water.

In the upper region of the chamber, a vertically-extending tubular partitioning plate may be arranged such that a reservoir containing an aqueous hydrofluoric acid solution is formed adjacent to the mist-generating chamber.

The high-frequency oscillation member is attached to the side wall of the mist-generating chamber and/or the bottom of the reservoir.

The high-frequency oscillation member attached to the side wall of the chamber is made up of: a case penetrating the side wall of the chamber and having a nozzle at the tip end thereof; an oscillation plate located in the case; an oscillation element attached to the oscillation plate and located opposite to the nozzle; and a pipe for supplying an aqueous hydrofluoric acid solution coupled to that portion of the case which is located outside the chamber and which is between the nozzle and the oscillation plate.

The high-frequency oscillation member attached to the bottom of the reservoir is made up of: a case attached to the bottom of the reservoir; an oscillation plate contained in the case and kept in contact with the aqueous hydrofluoric acid solution; and an oscillation element attached to the oscillation plate and located opposite to the aqueous hydrofluoric acid solution.

Each of the two high-frequency oscillation member is preferably designed such that the oscillation plate produces high-frequency oscillations in the range of 1 to 4 MHz when the oscillation element is supplied with high-frequency power from the high-frequency oscillator.

The gas ejected from the gas-ejecting means is preferably an inert gas, such as nitrogen, argon or helium.

The silicon wafer-cleaning apparatus mentioned above enables the two sides of silicon wafers to be uniformly etched with a high degree of purity on their surfaces, and further permits rising processing to be executed in the same chamber as that in which the etching treatment is executed. In addition, the apparatus prevents particles of contaminating substance from adhering to the silicon wafers when the silicon wafers have just been etched, and further prevents an oxide film from being excessively formed on the silicon wafers.

According to the present invention, the high-frequency oscillation member attached to the chamber (e.g., a high-frequency oscillation nozzle member which is made up of a case, a nozzle located at the tip end of the case, and an oscillation plate and an oscillator both contained in the case, and to which the pipe used for supplying an aqueous hydrofluoric acid solution is connected) is supplied with high-frequency power from the high-frequency oscillator. Simultaneously, the high-frequency oscillation member is supplied with the aqueous hydrofluoric acid solution. As a result, the high-frequency oscillation member produces mist of the aqueous hydrofluoric acid solution. The mist is of the order of microns to submicrons, and is directed toward the interior of the mist-generating chamber. Since the mist stays in the mist-generating chamber for a certain time, particles which are originally contained in the aqueous hydrofluoric acid solution and which result in secondary contamination are removed. After the mist of the aqueous hydrofluoric acid solution is produced in the mist-generating chamber in a sufficient amount, the shutter is driven to open the communication section of the partitioning wall. Thus, the mist enters the processing chamber through the communication section. The storage member, in which a plurality of silicon wafers are held in an upright state, is conveyed into the processing chamber beforehand. From the gas-ejecting means attached to the shutter and the chamber, an inert gas (e.g., a nitrogen gas) is ejected toward regions between the wafers, while simultaneously exhausting gas from the processing chamber by the gas exhaust means which is arranged inside the processing chamber to be lower than the storage member. By the stream of the inert gas, the mist of the aqueous hydrofluoric acid solution is carried to the silicon wafers, and adheres uniformly to the two sides of the silicon wafers. To be more specific, the mist adheres to the sides of the silicon wafers when it flows downward along the silicon wafers held in the storage member. As a result, the two sides of each wafer is etched by the highly-pure aqueous hydrofluoric acid solution.

After the etching treatment mentioned above, the communication section of the partitioning wall is closed with the shutter, and the mist in the processing chamber is exhausted by the exhaust means, while causing the gas-ejecting means to ceaselessly eject the inert gas toward regions between the silicon wafers. As a result, the mist is completely exhausted from the processing chamber, and the processing chamber is filled with the inert gas. Thus, particles of contaminating substance are prevented from adhering to the two sides of the silicon wafers even though the etched silicon wafers are active, and an oxide film is prevented from being excessively formed on the two sides of the silicon wafers. Under this condition, the pure water-spraying means sprays pure water toward regions between the silicon wafers, for rinsing the silicon wafers. Accordingly, the two sides of the silicon wafers are cleared of the aqueous hydrofluoric acid solution.

As mentioned above, the silicon wafer-cleaning apparatus of the present invention enables the two sides of silicon wafers to be uniformly etched with a high degree of purity on their surfaces, and further permits rising processing to be executed immediately after the etching treatment in the same chamber as that in which the etching treatment is executed. In addition, the apparatus prevents particles of contaminating substance from adhering to the silicon wafers when the silicon wafers have just been etched, and further prevents an oxide film from being excessively formed on the silicon wafers. Since the silicon wafers are subjected to the rinsing processing immediately after the etching treatment, they can be cleaned with a high degree of purity on their surfaces.

Where two high-frequency oscillation members are employed (one being attached to the side wall of the mist-generating chamber, and the other being attached to the bottom of the reservoir), the mist-generating chamber can be swiftly filled with mist of the aqueous hydrofluoric acid solution. In this case, the silicon wafers can be etched in a time shorter than that required where only one high-frequency oscillation member is employed.

Addition objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

A preferred embodiment of the present invention will now be described, with reference to FIGS. 1 and 2.

Figure 1:
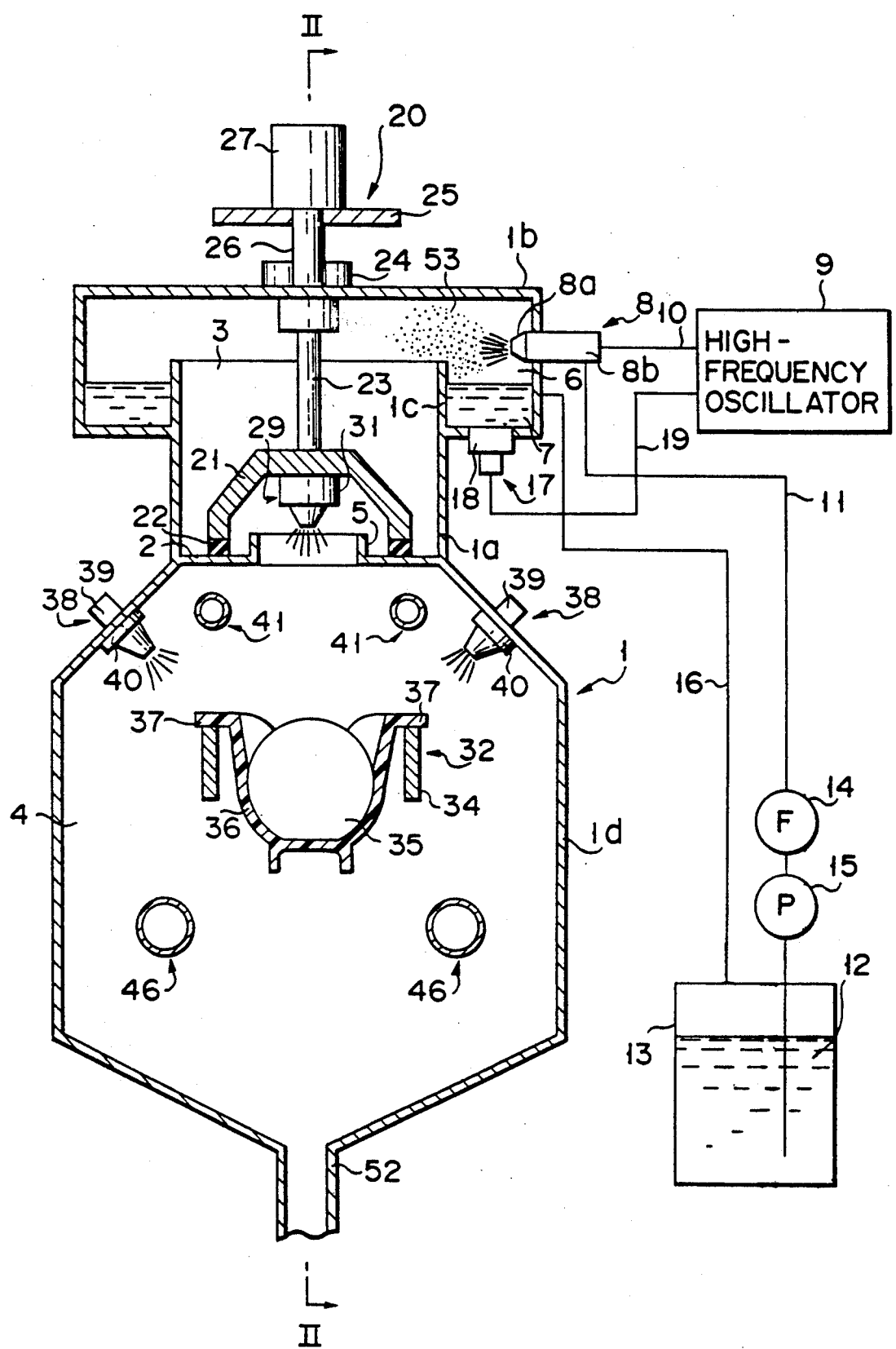
FIG. 1 is a schematic sectional view showing a cleaning apparatus according to one embodiment of the present invention.
Figure 2:
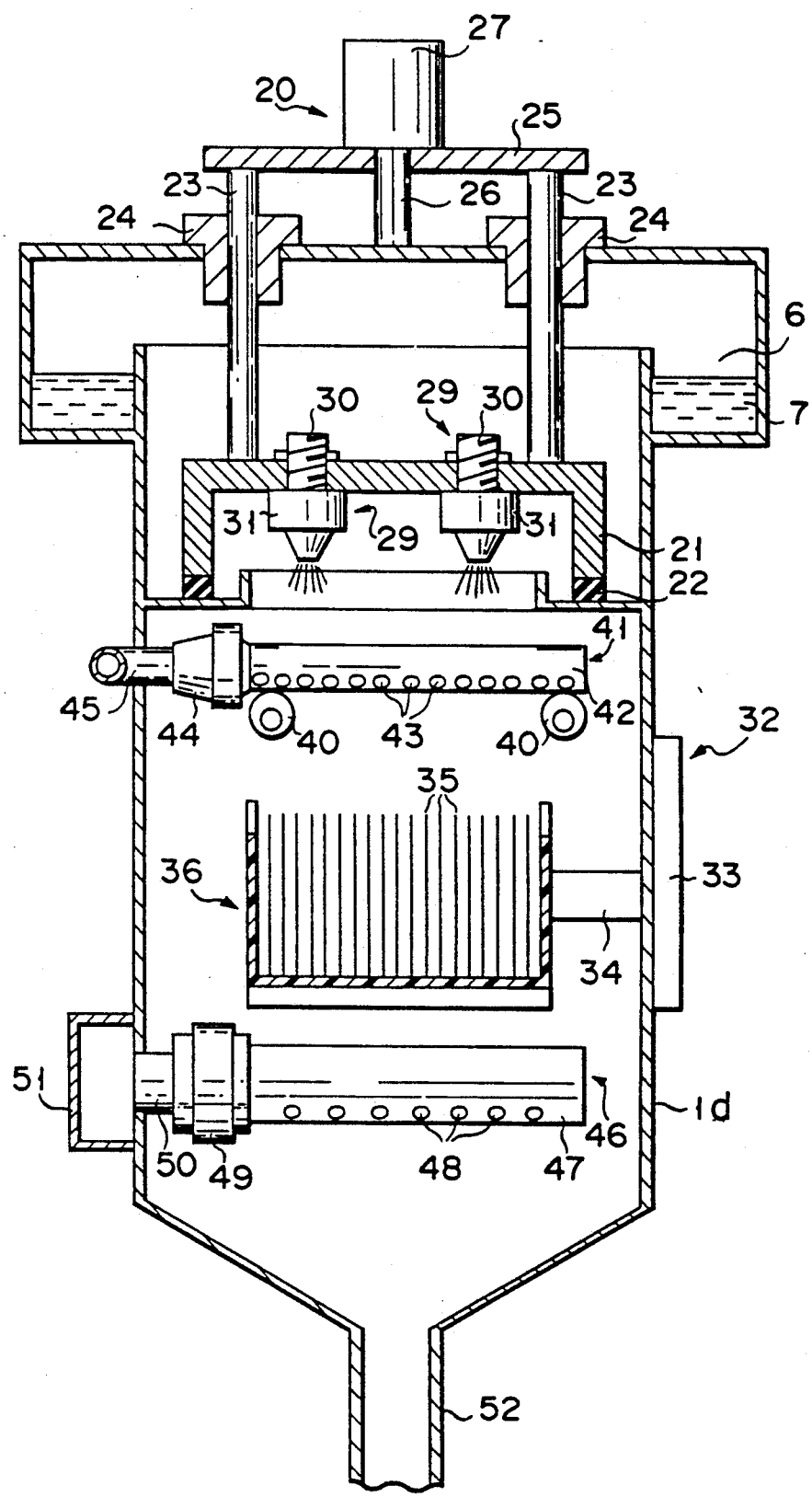
FIG. 2 is a sectional view taken along line II—II in FIG. 1.

FIG. 1 is a schematic sectional view showing a cleaning apparatus according to one embodiment of the present invention, while FIG. 2 is a sectional view taken along line II—II in FIG. 1. As is shown in FIGS. 1 and 2, a chamber 1, made of polytetrafluoroethylene, is divided into an upper region and a lower region by a partitioning wall 2. The upper region serves as a mist-generating chamber 3, while the lower region serves as a processing chamber 4. A rectangular wall 5, which constitutes a communication section, projects from the partitioning wall 2 into the mist-generating chamber 3.

The mist-generating chamber 3 (i.e., that region of chamber 1 which is located upper than the partitioning wall 2) is made up of: a vertically-extending hollow rectangular box 1a; a rectangular casing 1b being integral with the upper end of the hollow rectangular box 1a and having a cross section wider than that of the hollow rectangular box 1a; and a vertically-extending rectangular partitioning plate 1c integrally connected to the upper end of the hollow rectangular box 1a. The hollow rectangular box 1a and the rectangular casing 1b jointly define the mist-generating chamber 3 mentioned above. The rectangular partitioning plate 1c partitions the interior of the hollow rectangular box 1a in such a manner that a reservoir 6 is defined adjacent to the mist-generating chamber 3. This reservoir 6 contains an aqueous hydrofluoric acid solution 7, whose hydrogen fluoride concentration in the solution is 20%, for example. The processing chamber 4 (i.e., that region of chamber 1 which is located lower than the partitioning wall 2) is defined by a casing 1d having a heptagonal cross section.

A cylindrical high-frequency oscillation nozzle member 8, used for spraying an aqueous hydrofluoric acid solution, is attached to the side wall of the rectangular casing 1b of the chamber 1. The high-frequency oscillation nozzle member 8 comprises a case 8b having a bullet-shaped nozzle 8a. This nozzle 8 is fitted in a hole formed in the side wall of the rectangular casing 1b. The high-frequency oscillation nozzle member 8 also comprises an oscillation plate (not shown) contained therein and formed of tantalum, for example. The high-frequency oscillation nozzle member 8 further comprises an oscillation element (not shown) which is attached to the oscillation plate and located on the opposite side to that of the nozzle 8a. A high-frequency oscillator 9 is connected to the oscillation element of the high-frequency oscillation nozzle member 8 by means of a cable 10. When high-frequency power is supplied from the high-frequency oscillator 9 to the oscillation element of the oscillation nozzle member 8, the oscillation plate connected to the oscillation element produces high-frequency oscillation in the range of 1 to 4 MHz. One end of a supply pipe 11, used for supplying an aqueous hydrofluoric acid solution, is coupled to that portion of the case 8b which is located between the nozzle 8a and the oscillation plate. Through the supply pipe 11, an aqueous hydrofluoric acid solution 12, whose hydrogen fluoride concentration in the solution is 20%, for example, is supplied into the case 8b of the high-frequency oscillation nozzle member 8. The other end of the supply pipe 11 is coupled to a tub 13 in which an aqueous hydrofluoric acid solution 12 is contained. A filter 14, whose pores are less than 0.2 μm, and a pump 15 are provided for the supply pipe 11, such that the filter 14 is located closer to the high-frequency oscillation nozzle member 8 than the pump 15. One end of a drain pipe 16 is connected to the side wall of the rectangular casing 1b, such that the connected end is close to the surface level of the aqueous hydrofluoric acid solution 7 contained in the reservoir 6. The other end of the drain pipe 16 is inserted into the tub 13.

A high-frequency oscillation member 17 is connected to the rectangular casing 1b such that it is located at the bottom of the reservoir 6. The high-frequency oscillation member 17 comprises a case 18 attached to the bottom of the reservoir 6. It also comprises an oscillation plate (not shown) contained therein and formed of tantalum, for example. The oscillation member is kept in contact with the aqueous hydrofluoric acid solution 7. The high-frequency oscillation member 17 further comprises an oscillation element (not shown) attached to the oscillation plate and located opposite to the aqueous hydrofluoric acid solution 7. The high-frequency oscillator 9 mentioned above is connected to the oscillation element of the high-frequency oscillation member 17 by means of a cable 19. When high-frequency power is supplied from the high-frequency oscillator 9 to the oscillation element of the oscillation member 17, the oscillation plate connected to the oscillation element produces high-frequency oscillation in the range of 1 to 4 MHz.

In FIGS. 1 and 2, reference numeral 20 denotes an opening/closing mechanism. This mechanism 20 comprises a vertically-movable shutter 21 arranged in the mist-generating chamber 3. The shutter 21 is shaped like a box which is open at the bottom thereof. A frame-like seal 22, made of a fluorine-contained resin, for example, is attached to the lower end of the shutter 21, and is brought into contact with that portion of the partitioning wall 2 which is in the vicinity of the rectangular wall 5. As is shown in FIG. 2, the opening/closing mechanism 20 comprises two movable pins 23. The lower ends of these movable pins 23 are fixed to the upper surface of the shutter 21, while the upper ends thereof extend through the upper wall of the rectangular casing 1b and are located outside of the mist-generating chamber 3. Two bushes 24 are respectively fitted in two holes formed in the upper wall of casing 1b, and the pins 23 are inserted in the respective bushes 24. An O-ring (not shown) is located on the inner circumferential surface of each bush 24. A movable plate 25 is fixed to the upper ends of the pins 23. An air cylinder 27 comprising a piston rod 26 is fixed to the movable plate 25. The lower end of the piston rod 26 penetrates the movable plate 25 and is fixed to the upper wall of the rectangular casing 1b.

The operation of the opening/closing mechanism 20 mentioned above will be described. When the air cylinder 27 is driven, it moves upward by the reaction produced thereby, since, as mentioned above, the piston rod 26 is fixed to the upper wall of casing 1b. With the upward movement of the air cylinder 27, the movable plate 25, to which the air cylinder 27 is fixed, also moves upward. Since the two movable pins 23 to which the movable plate 25 is fixed also move upward, the shutter 21 fixed to the lower ends of the movable pins 23 moves upward. As a result, the rectangular wall 5, constituting the communication section, is opened. When the driving of the air cylinder 27 is stopped, the reaction produced by the driving is canceled, thus moving the air cylinder 27 downward. Since, therefore, the movable plate 25, the two movable pins 23 and the shutter 21 also move downward, the shutter 21 contacts the upper surface of the partitioning wall 2, thus closing the rectangular tubular wall 5.

Gas-ejecting nozzle members 29, the number of which is two, for example, are arranged on that portion of the shutter 21 which is located above the opening defined by the rectangular wall 5. Each gas-ejecting nozzle 29 is made up of: a cylindrical screw portion 30 threadably fitted in a hole formed in the shutter 21, and a nozzle 31 integrally coupled to the cylindrical screw portion 30 and projected downward from the shutter 21. Gas-supply pipes (not shown), the number of which is equal to that of the gas-ejecting nozzle members 29, are connected at one end to the respective cylindrical screw portions 30. The other ends of the gas-supply pipes penetrate the upper wall of the rectangular casing 1b and are connected to a nitrogen gas bomb (not shown), for example.

A conveyance mechanism 32 is arranged on the side wall of the casing 1d. The conveyance mechanism 32 comprises a hatch 33 formed in the side wall of the casing 1d. A guide plate (not shown) is arranged such that it can be slanted with reference to the hatch 33. A frame-like support member 34 engages with the guide plate, and is moved into the processing chamber 4 or moved out therefrom in association with the slanting of the guide plate. The frame-like support member 34 engages with the flanges 37 of a cassette 36, in which a plurality of silicon wafers 35 are held in an upright state. The cassette 36 is conveyed into the processing chamber 4 while being suspended by the frame-like support member. The rear portion of the support member 34 and the guide plate jointly serve as a cover with which to close the hatch 33.

Gas-ejecting nozzle members 38 are located on two of the slanted upper walls of the casing 1d. Where four gas-ejecting nozzle members 38 are employed, two nozzles 38 are provided for each of the two slanted upper walls. Each nozzle member 38 comprises a cylindrical screw portion 39 threadably fitted in a hole formed in the slanted upper wall, and a nozzle 40 integrally attached to the screw portion 39 and located in the processing chamber 4. The nozzle 40 is projected toward the wafers 35 conveyed into the processing chamber 4 by means of the conveyance mechanism 32. Although not shown, a plurality of gas supply pipes (the number of which is equal to the number of gas-ejecting nozzle members 38) is provided. One end of each gas supply pipe is coupled to the cylindrical screw portion 39 of the corresponding gas-ejecting nozzle member 38, while the other end thereof is coupled to a nitrogen gas bomb (not shown), for example.

A plurality of pure water-spraying nozzle members 41 (the number of which is two, for example) are arranged in the processing chamber 4 such that they are in the vicinity of the lower portion of the partitioning wall 2. The pure water-spraying nozzle members 41 extend in parallel to each other. Each nozzle member 41 comprises a hollow cylinder 42 which extends in the same direction as that in which the wafers 35 are arranged in the cassette 36. One end of the hollow cylinder 42 is closed, while the other end thereof is open. A plurality of apertures 43 are formed in the lower portion of the hollow cylinder 42 throughout the whole length thereof. A joint 44 is attached to the open end of the hollow cylinder 42. One end of a pure water supply pipe 45 is coupled to the joint 44, while the other end thereof extends through the side wall of the casing 1d and is coupled to a pure water supply (not shown). When pure water is supplied to the cylinder 42 through the supply pipe 45 and the joint 44, the wafers 35 held in the cassette 36 are sprinkled with the pure water output from the apertures 43.

A plurality of gas-exhausting members 46 (the number of which is two, for example) are arranged in the processing chamber 4 such that they are located under the cassette 36. The gas-exhausting members 46 extend in parallel to each other. Each gas-exhausting member 46 comprises a hollow cylinder 47 which extends in the same direction as that in which the wafers 35 are arranged in the cassette 36. One end of the hollow cylinder 47 is closed, while the other end thereof is open. A plurality of gas-suction apertures 48 are formed in the lower portion of the hollow cylinder 47 throughout the whole length thereof. A joint 49 is attached to the open end of the hollow cylinder 47. One end of a communication pipe 50 is coupled to the joint 49, while the other end thereof is fitted in a hole formed in the side wall of the casing 1d. A box 51, which defines a gas-exhaust chamber, is attached to the outer portion of the side wall of the casing 1d in such a manner that the box 51 surrounds the hole in which the communication pipe 50 is fitted. One end of a gas-exhaust pipe (not shown) is coupled to the box 51, while the other end thereof is coupled to a gas-exhaust fan (not shown). When the gas-exhaust fan is driven, the gas in the processing chamber 4 is sucked through the gas-suction apertures 48 and is exhausted by way of the hollow cylinder 47, the joint 49, the communication pipe 50, and the gas-exhaust pipe.

A drain pipe 52 for draining the aqueous hydrofluoric acid solution is located in the bottom of the casing 1d. Moreover, in the vicinity of the partitioning wall 2, one end of a drain tube (not shown) is attached to the side wall of the hollow rectangular box 1a. The other end of the drain tube is led out of the chamber 1. Through this drain tube, the aqueous hydrofluoric acid solution which collects on the partitioning wall 2 is drained to the outside of the chamber 1.

A description will now be given of the operation of the cleaning apparatus mentioned above.

First of all, the seal 22 at the lower end of the shutter 21 of the opening/closing mechanism 20 is brought into contact with the upper surface of the partitioning wall 2. As a result, the rectangular wall 5 is closed, thereby prohibiting the communication between the mist-generating chamber 3 and the processing chamber 4. The guide plate (not shown) of the hatch 33 is slanted toward the outside of the chamber 1. The cassette 36, which contains a plurality of wafers 35 held in an upright position and has flanges 37, is inserted along the inner surface of the guide plate. As a result, the flanges 37 of the cassette 36 engage with the frame-like support member 34, which is movable in association with the slanting of the guide plate, and the cassette 36 is suspended by the frame-like support member 34. When the guide plate is returned to the original position and the support member 34 pushed into the processing chamber 4, the cassette 36 is conveyed into the center of the interior of the processing chamber 4, as is shown in FIGS. 1 and 2. Simultaneous with this, the hatch 33 is closed with the rear portion of the support member 34 and the guide plate.

After the conveyance mechanism 32 has conveyed the cassette 36 into the processing chamber 4, a nitrogen gas is supplied from the nitrogen gas bomb to the gas-ejecting nozzle members 38 located on the two slanted upper walls of the casing 1d. As a result, the nitrogen gas is ejected over the cassette 36 inside the processing chamber 4 from the nozzle 40 of each nozzle member 38. Simultaneous with this, the gas-exhaust fan is driven. Therefore, the gas in the processing chamber 4 is exhausted through the gas-exhausting members 46, and the processing chamber 4 is filled with the nitrogen gas.

When the gas in the processing chamber is being replaced with the nitrogen gas, the pump 15 is driven. Therefore, the aqueous hydrofluoric acid solution 12 contained in the tub 13 is supplied to the cylindrical high-frequency oscillation nozzle member 8 via the supply pipe 11 provided with the filter 14. Further, high-frequency power is supplied from the high-frequency oscillator 9 to the oscillation element of the high-frequency oscillation nozzle member 8. As a result, the oscillation element starts oscillation, and the oscillation plate connected to the oscillation element produces high-frequency oscillation in the range of 1 to 4 MHz. Due to the supply of the aqueous hydrofluoric acid solution and the production of the high frequency oscillation in the range of 1 to 4 MHz, the mist 53 (which is of the order of microns to submicrons) of the aqueous hydrofluoric acid solution is directed toward the interior of the mist-generating chamber 3. Simultaneous with the driving of the high-frequency oscillation nozzle member 8, high-frequency power is supplied from the high-frequency oscillator 9 to the oscillation element of the oscillation member 17 located at the bottom of the reservoir 6. As a result, the oscillation plate connected to the oscillation element produces high-frequency oscillation in the range of 1 to 4 MHz. The high-frequency oscillation is transmitted to the aqueous hydrofluoric acid solution 7 contained in the reservoir 6, so that mist is produced from the aqueous hydrofluoric acid solution 7 and directed into the mist-generating chamber 3. Since the mist 53 generated in this manner stays in the mist-generating chamber 3 for a certain time, the particles originally contained in the aqueous hydrofluoric acid solution are removed. Most of the particles, thus removed from the aqueous hydrofluoric acid solution, drop into the reservoir 6. When the level of the aqueous hydrofluoric acid solution 7 rises to the predetermined point, the aqueous hydrofluoric acid solution 7 is drained through the drain pipe 16 and returned to the tub 13.

After mist 53 of the aqueous hydrofluoric acid solution is produced in the mist-generating chamber 3 in a sufficient amount, the air cylinder 27 of the opening/closing mechanism 20 is driven. Thus, the shutter 21 is moved upward, thus opening the rectangular wall 5. When the rectangular wall 5 is open, the mist flows from the mist-generating chamber 3 into the processing chamber 4 through the hole defined by the rectangular wall 5. Simultaneous with this, a nitrogen gas is supplied from the nitrogen gas bomb to the gas-ejecting nozzle members 29 through the gas-supply pipes. As a result, the nitrogen gas is ejected from the nozzle 31 of each nozzle member 29 and directed into the processing chamber 4. Due to the ejecting of the nitrogen gas from the nozzle members 29 and the gas-exhausting operation performed by the gas-exhausting members 46, the mist of the aqueous hydrofluoric acid solution entering the processing chamber 4 is carried toward the cassette 36 by the stream of the nitrogen gas ejected from the nozzle members 29 and 38. Thus, the mist of the aqueous hydrofluoric acid solution (the mist being free from particles) adheres uniformly to the two sides of the silicon wafers 35 stored in the cassette 36. Therefore, the two sides of each wafer are etched by the highly-pure aqueous hydrofluoric acid solution.

When the mist generated in the mist-generating chamber 3 flows into the processing chamber 4, part of the mist condenses into a liquid and attaches to the outer wall of the shutter 21. The resultant aqueous hydrofluoric acid solution drops onto the partitioning wall 2, flowing down along the shutter 21. This aqueous hydrofluoric acid solution is collected in the region defined by the partitioning wall 2 and the rectangular wall 5. The aqueous hydrofluoric acid solution is drained to the outside of the chamber 1 through the drain tube (not shown). Due to the rectangular wall 5, the aqueous hydrofluoric acid solution collecting on the partitioning wall 2 is prevented from dropping onto the wafers 35 inside the processing chamber 2. Since no aqueous hydrofluoric acid solution drops onto the wafers 35, uniform etching of the wafers 35 is ensured.

After the etching of the wafers 35, the driving of the air cylinder 27 is stopped. Thus, the shutter 21 is moved downward and closes the rectangular wall 5, thereby prohibiting the communication between the mist-generating chamber 3 and the processing chamber 4. Before the shutter 21 closes the rectangular wall 5, the supply of both high-frequency power and an aqueous hydrofluoric acid solution to the high-frequency oscillation nozzle member 8 is stopped, and the supply of high-frequency power to the high-frequency oscillation member 17 is also stopped. When the shutter 21 has closed the rectangular walls, the rotation of the gas-exhaust fan is increased, while continuously ejecting the nitrogen gas from the gas-ejecting nozzle members 29 and 38. As a result, the mist in the processing chamber 4 is swiftly exhausted through the gas-exhausting members 46, and the processing chamber 4 is filled with the nitrogen gas instead.

After the mist in the processing chamber 4 is completely replaced with the nitrogen gas, pure water is supplied into the pure water-spraying nozzle members 41 through the supply pipes 45, while continuing the ejecting of the nitrogen gas from the gas-ejecting nozzle members 29 and 38. Thus, the wafers 35 held in the cassette 36 are sprinkled with the pure water output from the apertures 43. As a result, the aqueous hydrofluoric acid solution is rinsed from the wafers 35. The rinsing water containing the aqueous hydrofluoric acid solution is drained toward the outside of the chamber 1 through the drain pipe 52.

After the rinsing operation mentioned above, the spraying of the pure water from the pure water-spraying nozzle members 41 and the ejecting of the nitrogen gas from the gas-ejecting nozzle members 29 and 38 are stopped. Thereafter, the guide plate, which closes the hatch 33 together with the rear portion of the support member 34, is slanted toward the outside of the chamber 1. Thus, the cassette 36 suspended by the frame-like support member 34 moves to the hatch 33 and is taken out of the processing chamber 4 through the hatch 33.

According to the cleaning apparatus mentioned above, the cylindrical high-frequency oscillation nozzle member 8 (which is attached to the side wall of the rectangular casing 1b of the chamber 1) and the high-frequency oscillation member 17 (which is located at the bottom of the reservoir 6) jointly produce mist (which is of the order of microns to submicrons) in the mist-generating chamber 3. After the mist-generating chamber 3 is filled with the mist, the shutter 21 is raised to open the rectangular wall 5 of the partitioning wall 2. Thus, the mist flows downward from the mist-generating chamber 3 into the processing chamber 4. Since a nitrogen gas is ejected from the gas-ejecting nozzle members 29 and 38, the mist is carried by the stream of the nitrogen gas and therefore adheres uniformly to the entirety of the two sides of each silicon wafer 35. The mist adhering to the wafers 35 is very pure since the particles which may result in secondary contamination are removed from the aqueous hydrofluoric acid solution when the mist stays in the mist-generating chamber 3. Thus, the two sides of each wafer 35 can be etched uniformly and with a high degree of purity on their surfaces.

After the etching treatment mentioned above, the shutter 21 is moved downward to close the rectangular wall 5, so that the communication between the mist-generating chamber 3 and the processing chamber 4 is prohibited. In this state, the rotation of the gas-exhaust fan is increased, while continuously ejecting the nitrogen gas from the gas-ejecting nozzle members 29 and 38. As a result, the mist in the processing chamber 4 is swiftly exhausted through the gas-exhausting members 46, and the processing chamber 4 is filled with the nitrogen gas instead. Thus, particles are prevented from adhering to the wafers 35 whose surfaces are still active due to the etching treatment. In addition, an oxide film is prevented from being excessively formed on the two sides of the silicon wafers.

After the mist in the processing chamber 4 is completely replaced with the nitrogen gas, pure water is sprayed over the wafers 35 from the pure water-spraying nozzle members 41, while continuing the spraying of the nitrogen gas from the gas-ejecting nozzle members 29 and 38. As a result, the aqueous hydrofluoric acid solution is rinsed from the two sides of the wafers 35.

As is understood from the above, the cleaning apparatus of the above embodiment enables the two sides of silicon wafers to be uniformly etched with a high degree of purity on their surfaces, and further permits rising processing to be executed in the same chamber as that in which the etching is executed. In addition, the apparatus prevents particles of contaminating substance from adhering to the silicon wafers when the silicon wafers have just been etched, and further prevents an oxide film from being excessively formed on the silicon wafers.

In the above embodiment, the high-frequency oscillation nozzle member attached to the side wall of the rectangular casing of the chamber is cylindrical, but this cylindrical nozzle member may be replaced with a bar-type one.

In the above embodiment, a nitrogen gas is ejected from the gas-ejecting nozzle members located on the shutter and the gas-ejecting nozzle members located on the slanted upper walls of the casing. However, an insert gas, such as an argon gas or a helium gas, may be ejected from the nozzle members, in place of the nitrogen gas. Further, both a nitrogen gas and pure water may be ejected from the nozzle members located on the shutter. Still further, both a nitrogen gas and a mixture of aqueous ammonia and aqueous hydrogen peroxide may be ejected from the nozzle members located on the slanted upper walls of the casing.

As has been described in the foregoing, the present invention provides a cleaning apparatus which enables the two sides of silicon wafers to be uniformly etched with a high degree of purity on their surfaces, permits rising processing to be executed in the same chamber as that in which the etching is executed, prevents particles of contaminating substance from adhering to the silicon wafers when the silicon wafers have just been etched, and further prevents an oxide film from being excessively formed on the silicon wafers.

Additional advantages and modifications will readily occurs to those skilled in the art. Therefore, the invention in its broader aspects is not limited to the specific details, an representative devices shown and described herein. Accordingly, various modifications may be made without departing from the spirit or scope of the general inventive concept as defined by the appended claims and their equivalents.

What is claimed is:

1. A silicon wafer-cleaning apparatus comprising:
    a chamber which is divided into an upper region and a lower region by a partitioning wall having a communication section, said upper region defining a mist-generating chamber and said lower region defining a processing chamber;
    opening/closing means including a shutter for closing the communication section of the partitioning wall;
    a high-frequency oscillation member, attached to the chamber, for generating mist of an aqueous hydrofluoric acid solution in the mist-generating chamber;
    a high-frequency oscillator for supplying high-frequency power to the high-frequency oscillation member;
    conveyance means for conveying a storage member, in which a plurality of silicon wafers are held in an upright state, to the processing chamber;
    a plurality of gas-ejecting means, attached to the chamber and the shutter, for ejecting a gas toward regions between the silicon wafers held in the storage member;
    pure water-spraying means, attached to the chamber, for spraying pure water toward regions between the silicon wafers held in the storage member; and
    gas exhaust means arranged inside the processing chamber to be lower than the storage member.

2. An apparatus according to claim 1, wherein said upper region of the chamber is partitioned by a vertically-extending tubular partitioning plate, and a reservoir containing an aqueous hydrofluoric acid solution is formed adjacent to the mist-generating chamber.

3. An apparatus according to claim 2, wherein said high-frequency oscillation member is attached to that side wall of the chamber which defines the mist-generating chamber, and also to that wall portion of the chamber which is located at a bottom of the reservoir.

4. An apparatus according to claim 3, wherein said high-frequency oscillation member attached to the side wall of the chamber includes: a case having a nozzle at the tip end thereof; an oscillation plate located inside the case; an oscillation element attached to the oscillation plate and located opposite to the nozzle; and a pipe for supplying an aqueous hydrofluoric acid solution to the high-frequency oscillation member attached to the side wall of the chamber, said pipe being coupled to that portion of the case which is located outside the chamber and which is between the nozzle and the oscillation plate.

5. An apparatus according to claim 3, wherein said high-frequency oscillation member attached to that bottom of the reservoir includes: a case attached to the bottom of the reservoir; an oscillation plate located inside the case and in contact with the aqueous hydrofluoric acid solution contained in the reservoir; and an oscillation element attached to the oscillation plate and located opposite to the aqueous hydrofluoric acid solution.

6. An apparatus according to claim 1, wherein said communication section of the partitioning wall is formed by a wall vertically extending from an upper surface of the partitioning wall.

7. An apparatus according to claim 1, wherein said gas ejected by the gas-ejecting means is an inert gas.

* * * * *